United States Patent
Lee et al.

(10) Patent No.: US 8,129,627 B2
(45) Date of Patent: Mar. 6, 2012

(54) CIRCUIT BOARD HAVING SEMICONDUCTOR CHIP

(75) Inventors: Woong Sun Lee, Gyeonggi-do (KR);
Qwan Ho Chung, Gyeonggi-do (KR);
Ki Young Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 264 days.

(21) Appl. No.: 12/604,586

(22) Filed: Oct. 23, 2009

(65) Prior Publication Data
US 2010/0326715 A1    Dec. 30, 2010

(30) Foreign Application Priority Data
Jun. 29, 2009  (KR) .................. 10-2009-0058571

(51) Int. Cl.
*H05K 1/16* (2006.01)
(52) U.S. Cl. ........ 174/260; 174/250; 174/252; 174/262; 174/267; 174/524; 361/704; 361/760; 361/765; 361/766; 361/767; 257/368; 257/529; 257/738; 257/780; 257/786; 438/113; 438/612; 438/614; 438/622; 438/687

(58) Field of Classification Search .................. 174/260, 174/250, 252, 262, 267, 524; 361/704, 760, 361/765, 766, 767; 257/368, 529, 738, 780, 257/786; 438/113, 612, 614, 622, 687
See application file for complete search history.

(56) References Cited

FOREIGN PATENT DOCUMENTS

| KR | 1999-0031213 U | 7/1999 |
| KR | 2001-0060271 A | 7/2001 |
| KR | 2008-0005101 A | 1/2008 |

*Primary Examiner* — Xiaoliang Chen
(74) *Attorney, Agent, or Firm* — Ladas & Parry LLP

(57) ABSTRACT

A circuit board includes a semiconductor chip having an upper surface and side surfaces connected to the upper surface. A bonding pad is disposed on the upper surface of the semiconductor chip. A bump is disposed on the bonding pad and projects from the bonding pad by a predetermined height. A circuit board body has a recess part, and the semiconductor chip is positioned in the recess part so that the circuit board body covers the upper surface and the side surfaces of the semiconductor chip while exposing an end of the bump. A wiring line is disposed on the circuit board body and part of the wiring line is positioned over the bump. An opening is formed in a portion of the part of the wiring line over the bump to expose the bump. A reinforcing member physically and electrically connects the exposed bump and the wiring line.

20 Claims, 8 Drawing Sheets

CIRCUIT BOARD HAVING SEMICONDUCTOR CHIP

CROSS-REFERENCE TO RELATED APPLICATIONS

The present application claims priority to Korean patent application number 10-2009-0058571 filed on Jun. 29, 2009, which is incorporated herein by reference in its entirety.

BACKGROUND OF THE INVENTION

The present invention relates generally to semiconductor technology, and more particularly, to a circuit board having a semiconductor chip embedded therein.

These days, semiconductor chips and the semiconductor packages containing the semiconductor chips are under constant development to satisfy the demand for a device that is capable of both storing and processing massive amounts of data within extremely short time periods.

For example, recently developed semiconductor packages include boards onto which semiconductor chips are mounted. After the semiconductor chips are mounted onto the boards, the boards and the semiconductor chips are secured using molding members.

Thus, in the semiconductor packages the semiconductor chips project from the boards. Accordingly, in a design including the semiconductor package, consideration must be given to the volume occupied by the board and the semiconductor chip projecting therefrom.

BRIEF SUMMARY OF THE INVENTION

Embodiments of the present invention are directed to a circuit board having a semiconductor chip embedded therein so that the volume of a semiconductor package is reduced.

In an embodiment of the present invention, a circuit board comprises a semiconductor chip having an upper surface, side surfaces which are connected to the upper surface, and a bonding pad which is disposed on the upper surface; a bump disposed on the bonding pad and projecting from the bonding pad by a predetermined height; a circuit board body having a recess part which covers the upper surface and the side surfaces of the semiconductor chip and exposes an end of the bump; a wiring line disposed on the circuit board body and having one portion which is positioned over the bump and the other portion which is defined with an opening to expose the bump; and a reinforcing member physically and electrically connecting the bump exposed through the opening and the wiring line.

The opening of the wiring line may, for example, have the shape of a circle, an ellipse, a polygon or a cross when viewed from the top.

The reinforcing member may include a plated layer.

The reinforcing member may contain the same metal as the bump.

Further, alternatively, the reinforcing member may contain a metal different from the metal used for the bump.

The bump may contain, for example, at least one of gold, chrome, silver, copper, aluminum, nickel and solder.

The reinforcing member may contain, for example, at least one selected from the group consisting of gold, chrome, silver, copper, aluminum, nickel, solder, and conductive polymer.

The wiring line may have a width less than that of the bump.

The reinforcing member may cover the exposed bump and upper and side surfaces of the wiring line.

An insulation member may be interposed between the bump and the wiring line, and the bump and the wiring line are physically and electrically connected to each other by the reinforcing member.

The circuit board may further comprise semiconductor devices disposed on a surface of the insulation member and electrically connected to the wiring line.

The circuit board may further comprise semiconductor devices disposed in the insulation member; and conductive vias electrically connecting the semiconductor devices and wiring lines.

The circuit board may further comprise a cover board disposed on a lower surface of the semiconductor chip which faces away from the upper surface and a lower surface of the circuit board body which corresponds to the lower surface of the semiconductor chip.

The circuit board may further comprise an additional wiring line disposed on the lower surface of the semiconductor chip which faces away from the upper surface and the lower surface of the circuit board body which corresponds to the lower surface of the semiconductor chip; and a conductive via electrically connecting the wiring line and the additional wiring line.

A conductive ball may be electrically connected to at least one of the wiring line and the additional wiring line.

The opening may be defined in at least one of both ends of the wiring line so as to expose the bump.

The bump may have a recess part which is defined at a position corresponding to the opening.

At least two wiring lines and at least two circuit board bodies may be alternately disposed, and the wiring lines disposed on the respective circuit board bodies are electrically connected by means of conductive vias.

DESCRIPTION OF SPECIFIC EMBODIMENTS

Figure 1:
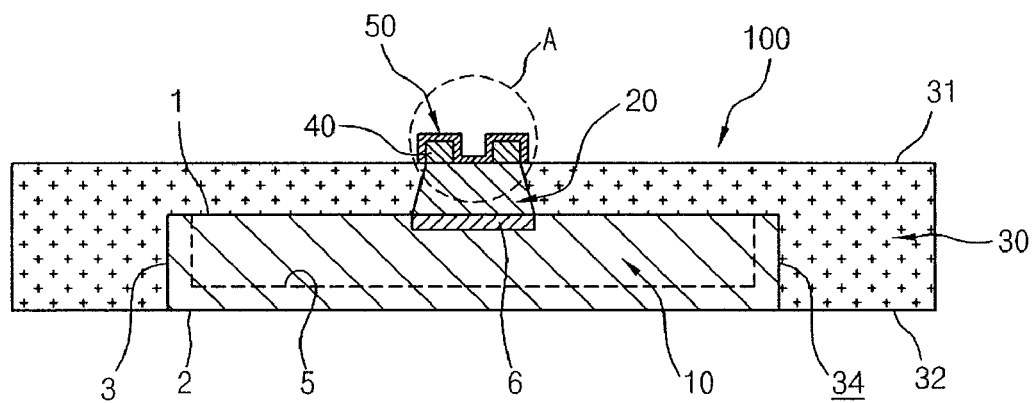
FIG. 1 is a cross-sectional view illustrating a circuit board having a semiconductor chip in accordance with an embodiment of the present invention.
Figure 2:
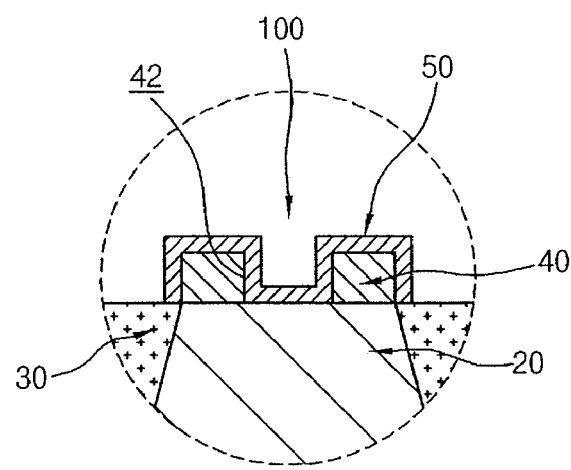
FIG. 2 is an enlarged view of the part 'A' shown in FIG. 1.

Hereinafter, embodiments of the present invention will be described with reference to the accompanying drawings. FIG. 1 is a cross-sectional view showing a circuit board having a semiconductor chip in accordance with an embodiment of the present invention. FIG. 2 is an enlarged view of the part 'A' shown in FIG. 1.

Referring to FIGS. 1 and 2, a circuit board 100 having a semiconductor chip includes a semiconductor chip 10, a bump 20, a circuit board body 30, a wiring line 40, and a reinforcing member 50.

For example, the semiconductor chip 10 shown in FIG. 1 has the shape of a rectangular hexahedron, although it should be understood the semiconductor chip 10 is not limited to this shape. The semiconductor chip 10 includes an upper surface 1, a lower surface 2 which faces away from the upper surface 1, and four side surfaces 3 which connect the upper surface 1 and the lower surface 2.

The semiconductor chip 10 includes a circuit section 5. The circuit section 5 includes a data storage unit (not shown) for storing data and/or a data processing unit (not shown) for processing data.

The semiconductor chip 10 includes bonding pads 6 which are electrically connected to the circuit section 5. In an embodiment, for example, the embodiment shown in FIG. 1, the bonding pads 6 are disposed along the center portion of the upper surface 1 of the semiconductor chip 10. Alternatively, the bonding pads 6 of the semiconductor chip 10 may be disposed adjacent to the edges of the upper surface 1 of the semiconductor chip 10.

The bump 20 is disposed on each bonding pad 6 of the semiconductor chip 10. The bump 20 has the shape of, for example, a column. The bump 20 projects from the bonding pad 6 by a predetermined height. In an embodiment, a side surface of the bump is formed at an angle so that the upper surface of the bump has a larger area than the lower surface of the bump. Examples of metals that may be used as the bump 20 include gold, chrome, silver, copper, aluminum, nickel, and solder. Further, in an embodiment the bump 20 may contain a conductive polymer such as poly(3,4)-ethylenedioxythiophene (PEDOT).

The circuit board body 30 has the shape of a rectangular hexahedral plate which has a first surface 31 and a second surface 32 facing away from the first surface 31. An example of a material that may be used as the circuit board body 30 is a thermosetting synthetic resin. Alternatively, the circuit board body 30 may also, of course, contain a thermoplastic resin. The circuit board 30 may be a printed circuit board including conductive traces and on which electronic components are attached.

The circuit board body 30 has a recess part 34. The recess part 34 of the circuit board body 30 is defined so as to extend from the second surface 32 to the first surface 31 of the circuit board body 30.

The recess part 34 is shaped so as to receive the semiconductor chip 10 and the bump 20, and such that an end of the bump 20 is exposed on the first surface 31 of the circuit board body 30. In an embodiment, the upper surface 1 and the side surfaces 3 of the semiconductor chip 10 are received in the recess part 34 and are covered by the circuit board body 30. In an embodiment, a first portion of the recess has a first shape that is substantially the same as that of the semiconductor chip 10, and a second portion of the recess has a second shape that is substantially the same as that of the bump 20 formed on the semiconductor chip.

In an embodiment, for example the embodiment shown in FIG. 1, the exposed end of the bump 20 may be substantially flush with the first surface 31 of the circuit board body 30. Alternatively, in an embodiment, the exposed end of the bump 20 may be disposed at a position lower than the first surface 31 of the circuit board body 30 and may also be covered by the first surface 31 of the circuit board body 30.

The wiring line 40 is disposed on the first surface 31 of the circuit board body 30. In an embodiment, the wiring line 40 has the shape of a line when viewed from the top. Examples of materials that may be used as the wiring line 40 include gold, chrome, silver, copper, aluminum, nickel and solder. In an embodiment, the wiring line 40 may contain substantially the same metal as the bump 20.

One end of the wiring line 40 contacts the bump 20 which is exposed due to the recess part 34 the circuit board body 30, and the other end of the wiring line 40, which is opposite to the one end, extends to the edge of the circuit board body 30 on the first surface 31 of the circuit board body 30. In an embodiment, the wiring line 40 and the bump 20 simply contact each other. The wiring line 40 and the bump 20 may be electrically detached from each other when changes in the contour of the first surface 31 of the circuit board body 30 occur.

The wiring line 40 has an opening 42. A portion of the bump 20 corresponding to the opening 42 is exposed through the opening 42, and the remaining portion of the bump 20 is covered by the wiring line 40.

In an embodiment, the wiring line 40 may have a width less than that of the bump 20. Alternatively, the wiring line 40 may have a width greater than that of the bump 20. In another alternative embodiment, the portion of the wiring line 40 corresponding to the bump 20 (that is, the portion that is formed over the bump) may have a width greater than that of the bump 20, and the remaining portion of the wiring line 40 may have a width less than that of the bump 20.

FIGS. 3 through 6 are plan views showing embodiments of the wiring lines and the openings defined in the wiring lines of the embodiment shown in FIG. 1.

Figure 3:
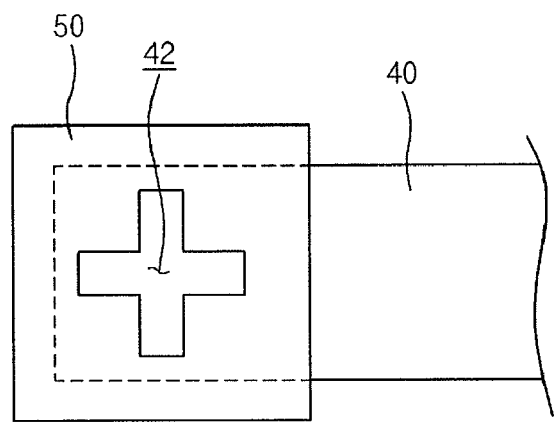
FIGS. 3 through 6 are plan views showing wiring lines and openings defined in the wiring lines according to an embodiment of the present invention.
Figure 4:
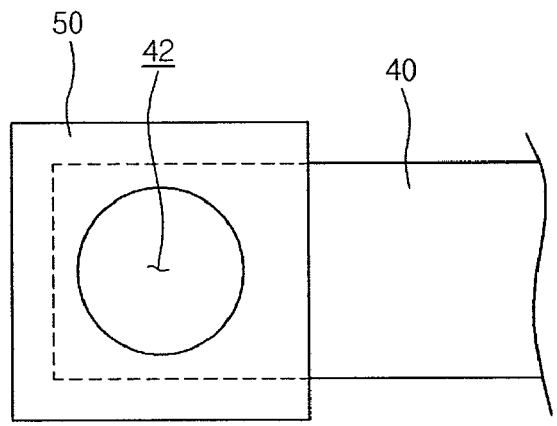
Figure 5:
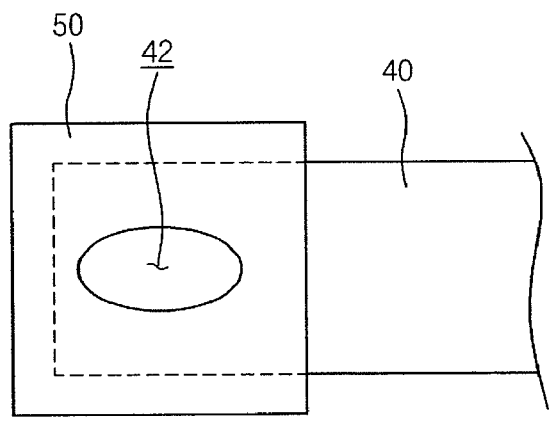
Figure 6:
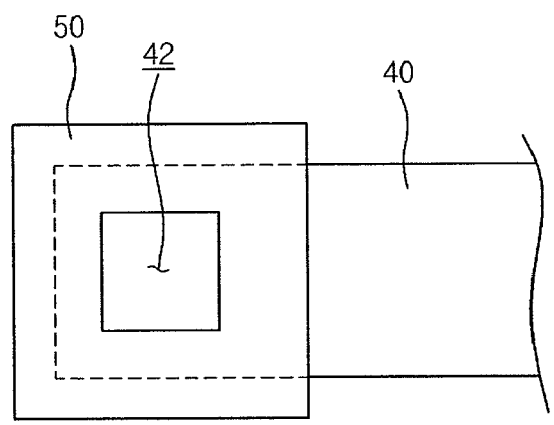

Referring to FIG. 3, in an embodiment, the opening 42 of the wiring line 40 may have the shape of a cross when viewed from the top. Referring to FIG. 4, in another embodiment, the opening 42 of the wiring line 40 may have a circular shape when viewed from the top. Referring to FIG. 5, in another embodiment, the opening 42 of the wiring line 40 may have an elliptical shape when viewed from the top. Referring to FIG. 6, in another embodiment, the opening 42 of the wiring line 40 may have a polygonal shape when viewed from the top.

In the embodiments shown in FIGS. 3 through 6, the opening 42 of the wiring line 40 has a width less than the width of the wiring line 40. The opening 42 of the wiring line 40 shown in FIGS. 3 through 6 increases the contact area of the reinforcing member 50, which physically and electrically connects the bump 20 and the wiring line 40. In an embodiment, at least two openings 42 may be defined in the wiring line 40 so as to further increase the contact area of the reinforcing member connecting the wiring line 40 and the bump 20.

At least two circuit board bodies 30 and at least two wiring lines 40 disposed on the respective first surfaces 31 of the circuit board bodies 30 may be alternately placed according to an embodiment of the present embodiment. The wiring lines 40 which are disposed on the respective circuit board bodies 30 may then be electrically connected to each other by conductive vias formed through one or more of the circuit board bodies 30 depending on the arrangement, and conductive balls such as solder balls may be attached to the uppermost wiring line.

Figure 7:
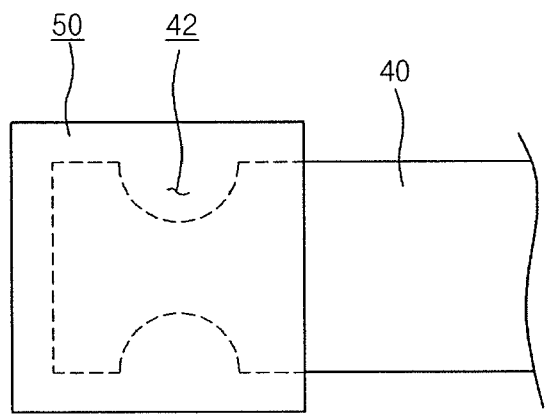
FIG. 7 is a plan view showing a wiring line and an opening defined in the wiring line according to a variation of the embodiment shown in FIG. 1 of the present invention.

FIG. 7 is a plan view showing a wiring line and an opening defined in the wiring line according to a variation in the embodiment of the present invention shown in FIG. 1.

Referring to FIG. 7, the opening 42 of the wiring line 40 may be defined in at least one of the side surfaces of the portion of the wiring line 40 over the bump 20. When openings 42 are defined in each of the two opposing side surfaces of the wiring line 40 as is shown in FIG. 7, the contact area of the reinforcing member 50 with the wiring line 40 and the bump 20 may be further increased.

Referring again to FIG. 2, the reinforcing member 50 physically and electrically connects the portion of the bump 20 exposed through the opening 42 and the wiring line 40 to each other. That is to say, the reinforcing member 50 both physically connects the wiring line 40 to the bump 20 so as to prevent the wiring line 40 and the bump 20, which simply contact each other, from being detached from each other, and also electrically connects the wiring line 40 to the bump 20.

Examples of materials that may be used as the reinforcing member 50, which physically and electrically connects the bump 20 and the wiring line 40, include gold, chrome, silver, copper, aluminum, nickel and solder.

In an embodiment of the present invention, the reinforcing member 50 may include substantially a metal that is substantially the same as the metal used as the bump 20 and the wiring line 40.

For example, when the reinforcing member 50, the bump 20 and the wiring line 40 each contain copper, it is possible to prevent cracking and/or damage to the reinforcing member 50, the bump 20 and the wiring line 40 caused when the reinforcing member 50, the bump 20 and the wiring line 40 have different thermal expansion coefficients.

Meanwhile, the reinforcing member 50 may instead contain a metal different from that used for the bump 20 and the wiring line 40.

For example, when the bump 20 and the wiring line 40 contain a metal such as copper having a first hardness, the reinforcing member 50 may contain a metal such as solder having a second hardness lower than the first hardness.

The reinforcing member 50 may be a plated layer which is formed through a plating process such as electroplating or electroless plating. Alternatively, the reinforcing member 50 may be a deposited layer which is formed through a physical vapor deposition process such as sputtering or a chemical vapor deposition process.

In an embodiment of the present invention, the portion of the bump 20 exposed through the opening 42 of the wiring line 40 and the exposed upper and side surfaces of the wiring line are each covered by the reinforcing member 50, whereby the reinforcing member physically and electrically connects the bump 20 to the wiring 40. For example, in the event that the width of the wiring line 40 is less than the width of the bump 20 and the reinforcing member 50 is formed through a plating process, a physical vapor deposition process, or a chemical vapor deposition process; the portion of the bump 20 exposed through the opening 42 of the wiring line 40 and the upper and side surfaces of the wiring line 40 are all covered by the reinforcing member 50, and the reinforcing member 50 may thus be physically and electrically connected to the bump 20 and the wiring line 40.

Figure 8:
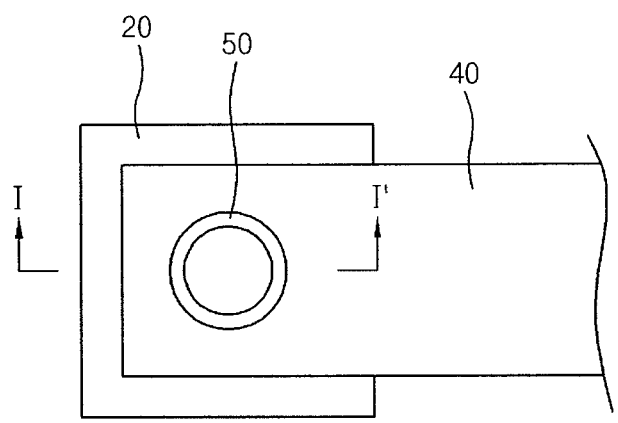
FIG. 8 is a plan view showing a wiring line and a reinforcing member according to another variation of the embodiment shown in FIG. 1 of the present invention.
Figure 9:
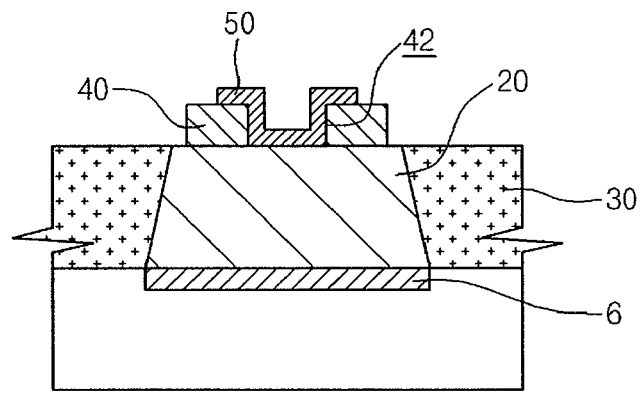
FIG. 9 is a cross-sectional view taken along the line I-I' of FIG. 8.

FIG. 8 is a plan view showing a wiring line and a reinforcing member according to another variation of the embodiment of the present invention shown in FIG. 1. FIG. 9 is a cross-sectional view taken along the line I-I' of FIG. 8.

Referring to FIGS. 8 and 9, one end of the wiring line 40 is disposed on the bump 20, and the opening 42 is defined through the one end of the wiring line 40 to expose a portion of the bump 20. In the embodiment shown in FIGS. 8-9, the reinforcing member 50 is selectively formed to cover the portion of the bump 20 exposed through the opening 42 and only a portion of the wiring line 40 which is positioned around the opening 42.

Figure 10:
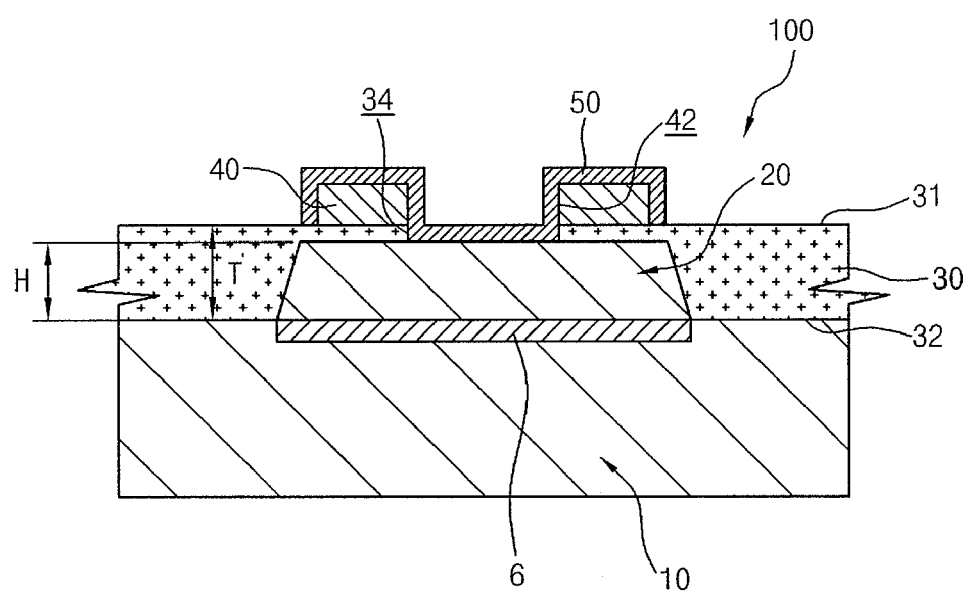
FIG. 10 is a cross-sectional view showing a circuit board having a semiconductor chip in accordance with another embodiment of the present invention.

FIG. 10 is a cross-sectional view showing a circuit board having a semiconductor chip in accordance with an embodiment of the present invention. The circuit board having a semiconductor chip shown in FIG. 10 has the same construction as the circuit board having a semiconductor chip described above with reference to FIG. 1, except the circuit board body. Therefore, repeated descriptions of the same component parts will be omitted herein, and the same technical terms and the same reference numerals will be used to refer to the same component parts.

Referring to FIG. 10, a circuit board 100 having a semiconductor chip includes a semiconductor chip 10, a bump 20, a circuit board body 30, a wiring line 40 and a reinforcing member 50.

The bump 20, which is connected to a bonding pad 6 of the semiconductor chip 10, projects from an upper surface 1 of the semiconductor chip 10 by a predetermined height H. The circuit board body 30 covers the upper surface 1 and side surfaces 3 of the semiconductor chip 10. In the present embodiment, the circuit board body 30 has a thickness T that is measured between the upper surface 1 of the semiconductor chip 10 and a first surface 31 of the circuit board body 30. The thickness T is greater than the height H of the bump 20. Therefore, part of the upper surface of the bump 20 is covered by the circuit board body 30.

The circuit board body 30 has an opening 34 which exposes a portion of the bump 20 covered by the circuit board body 30. The opening 34 may expose a portion or the entirety of the bump 20, and the reinforcing member 50 physically and electrically connects the bump 20 exposed through the opening 34 of the circuit board body 30 and the wiring line 40.

In an embodiment, the circuit board body 30 is made to cover the bump 20 by forming the circuit board body 30 through a heat pressing process or an injection molding process. In the case in which the circuit board body 30 covers the bump 20, the wiring line 40 and the bump 20 are not electrically connected to each other, and therefore, the connection could be considered inferior.

However, in the present embodiment, due to the fact that the opening 34 for exposing the bump 20 is defined in the circuit board body 30 with the circuit board body 30 covering the bump 20, and the reinforcing member 50 physically and electrically connects the bump 20 exposed through the opening 34 and the wiring line 40, it is possible to prevent an inferior connection from being caused between the wiring line 40 and the bump 20.

Figure 11:
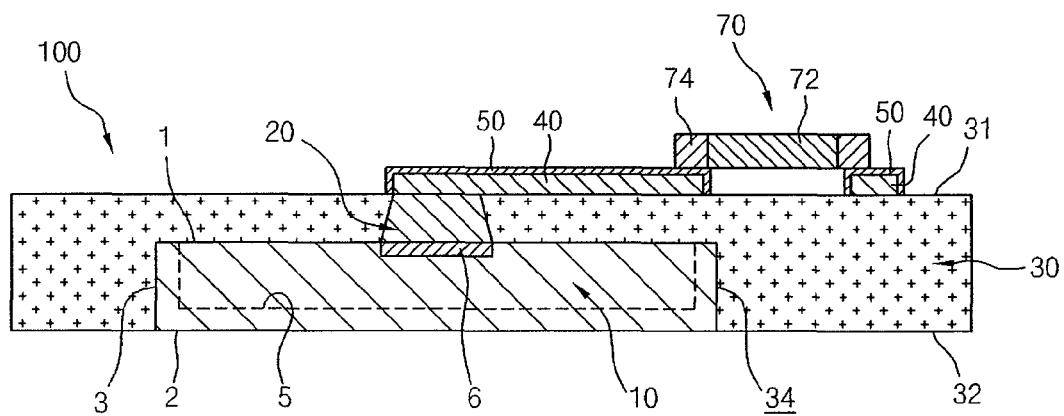
FIG. 11 is a cross-sectional view showing a circuit board having a semiconductor chip in accordance with another embodiment of the present invention.

FIG. 11 is a cross-sectional view showing a circuit board having a semiconductor chip in accordance with another embodiment of the present invention. The circuit board having a semiconductor chip in accordance with the embodiment shown in FIG. 11 has the same construction as the circuit board having a semiconductor chip which is described above with reference to FIG. 1, except FIG. 11 shows a semiconductor device. Therefore, repeated descriptions of the same component parts will be omitted herein, and the same technical terms and the same reference numerals will be used to refer to the same component parts.

Referring to FIG. 11, a circuit board 100 having a semiconductor chip includes a semiconductor chip 10, a bump 20, a circuit board body 30, a wiring line 40, a reinforcing member 50, and a semiconductor device 70.

The semiconductor device 70 is disposed, for example, over a first surface 31 of the circuit board body 30. The semiconductor device 70 disposed over the first surface 31 of the circuit board body 30 includes a semiconductor device body 72 and a connection terminal 74. The semiconductor device 70 may be, for example, a passive device such as a transistor, a diode, an inductor and a resistor or an active device.

A solder resist pattern, which has an opening for exposing a portion of the wiring line 40, is formed over the first surface 31 of the circuit board body 30, and the connection terminal 74 of the semiconductor device 70 may be electrically connected to the wiring line 40 which is disposed on the first surface 31 of the circuit board body 30.

Figure 12:
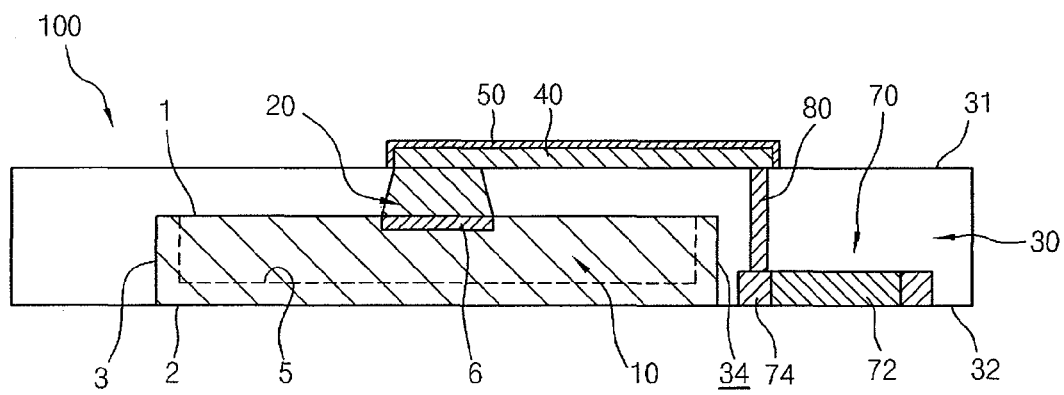
FIG. 12 is a cross-sectional view showing a circuit board having a semiconductor chip in accordance with another embodiment of the present invention.

FIG. 12 is a cross-sectional view showing a circuit board having a semiconductor chip in accordance with another embodiment of the present invention. The circuit board having a semiconductor chip in accordance with the embodiment shown in FIG. 12 has the same construction as the circuit board having a semiconductor chip which is described above with reference to FIG. 11, except the semiconductor device. Therefore, repeated descriptions of the same component parts will be omitted herein, and the same technical terms and the same reference numerals will be used to refer to the same component parts.

Referring to FIG. 12, a circuit board 100 having a semiconductor chip includes a semiconductor chip 10, a bump 20, a circuit board body 30, a wiring line 40, a reinforcing member 50, a semiconductor device 70, and a conductive via 80.

In an embodiment, the semiconductor device 70 is disposed in the circuit board body 30. For example, as shown in FIG. 12, the semiconductor device 70 may be disposed in a second surface 32 of the circuit board body 30. The semiconductor device 70 includes a semiconductor device body 72 and a connection terminal 74. The semiconductor device 70 may be, for example, a passive device such as a transistor, a diode, an inductor and a resistor or an active device.

The semiconductor device 70 disposed in the circuit board body 30 is electrically connected to the wiring line 40 using the conductive via 80. The conductive via 80 passes through the circuit board body from the first surface 31 to the connection terminal 74 in the second surface 32 of the circuit board body 30. A first end of the conductive via 80 is electrically connected to the connection terminal 74 of the semiconductor device 70, and a second end of is the conductive via 80 opposite to the first end is electrically connected to the wiring line 40. Alternatively, the second end of the conductive via 80 may be electrically connected to the reinforcing member 50 covering the wiring line 40. For example, when the wiring line 40 and the second end of the conductive via 80 are separated from each other, the second end of the conductive via 80 may then instead be electrically connected to the reinforcing member 50.

In an embodiment, for example the embodiment shown in FIG. 12, the connection terminal 74 may be exposed from the second surface 32 of the circuit board body 30. Thus, a solder ball or the like may be additionally attached to the exposed connection terminal 74 of the semiconductor device 70.

Figure 13:
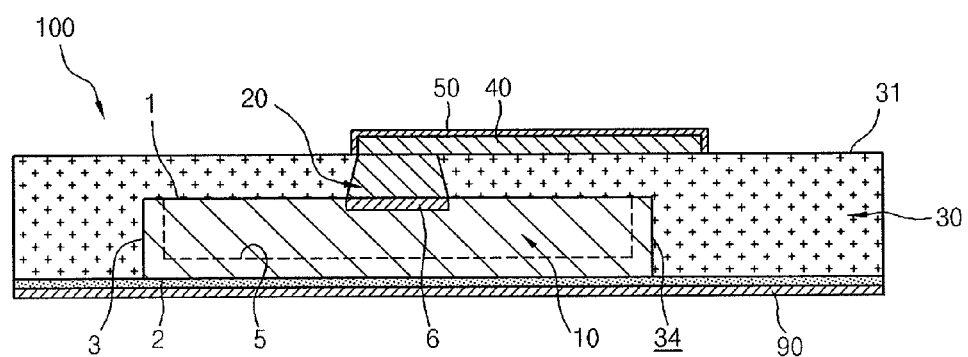
FIG. 13 is a cross-sectional view showing a circuit board having a semiconductor chip in accordance with another embodiment of the present invention.

FIG. 13 is a cross-sectional view showing a circuit board having a semiconductor chip in accordance with an embodiment of the present invention. The circuit board having a semiconductor chip in accordance with the embodiment shown in FIG. 13 has the same construction as the circuit board having a semiconductor chip which is described above with reference to FIG. 1, except the addition of a cover board. Therefore, repeated descriptions of the same component parts will be omitted herein, and the same technical terms and the same reference numerals will be used to refer to the same component parts.

Referring to FIG. 13, a circuit board 100 having a semiconductor chip includes a semiconductor chip 10, a bump 20, a circuit board body 30, a wiring line 40, a reinforcing member 50, and a cover board 90.

The cover board 90 covers a second surface 32 of the circuit board body 30 and a lower surface 2 of the semiconductor chip 10. The cover board 90 may be, for example, a synthetic resin board or a metal board. The cover board 90 covers the second surface 32 of the circuit board body 30 which is exposed to the outside, so as to the protect the semiconductor chip 10 from external shock and vibration. When the cover board 90 is a metal board, the cover board 90 may be, for example, a copper board or an aluminum board. When a copper board or an aluminum board is used as the cover board 90, heat generated in the semiconductor chip 10 may be quickly dissipated to the outside, whereby the performance of the semiconductor chip 10 may be improved.

Figure 14:
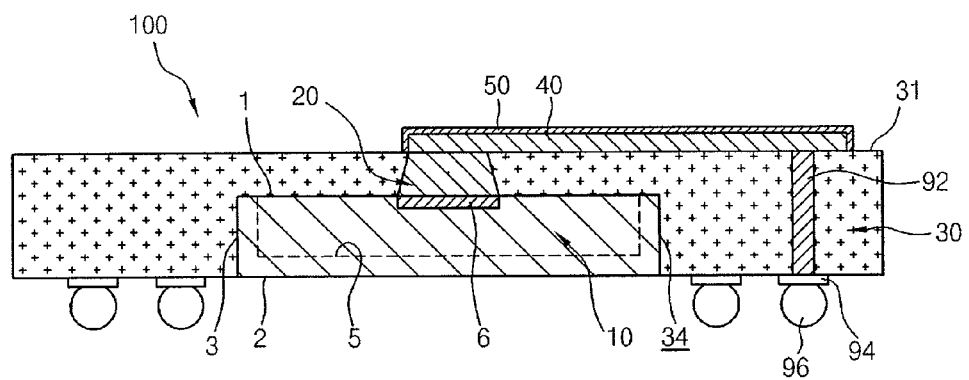
FIG. 14 is a cross-sectional view showing a circuit board having a semiconductor chip in accordance with another embodiment of the present invention.

FIG. 14 is a cross-sectional view showing a circuit board having a semiconductor chip in accordance with an embodiment of the present invention. The circuit board having a semiconductor chip in accordance with the embodiment shown in FIG. 14 has the same construction as the circuit board having a semiconductor chip which is described above with reference to FIG. 1, except the addition of a conductive via, an additional wiring line and a conductive ball. Therefore, repeated descriptions of the same component parts will be omitted herein, and the same technical terms and the same reference numerals will be used to refer to the same component parts.

Referring to FIG. 14, a circuit board 100 having a semiconductor chip includes a semiconductor chip 10, a bump 20, a circuit board body 30, a wiring line 40, a reinforcing member 50, a conductive via 92, an additional wiring line 94, and a conductive ball 96.

The conductive via 92 passes through the circuit board body from a first surface 31 to a second surface 32 of the circuit board body 30. A first end of the conductive via 92 is electrically connected to the wiring line 40.

The additional wiring line 94 may be formed on the second surface 32 of the circuit board body 30 and/or a lower surface 2 of the semiconductor chip 10. A second end of the conductive via 92 opposite to the first end is electrically connected to the additional wiring line 94.

The conductive ball 96 is electrically connected to the additional wiring line 94. In the present embodiment, the conductive ball 96 may comprise a solder ball.

Figure 15:
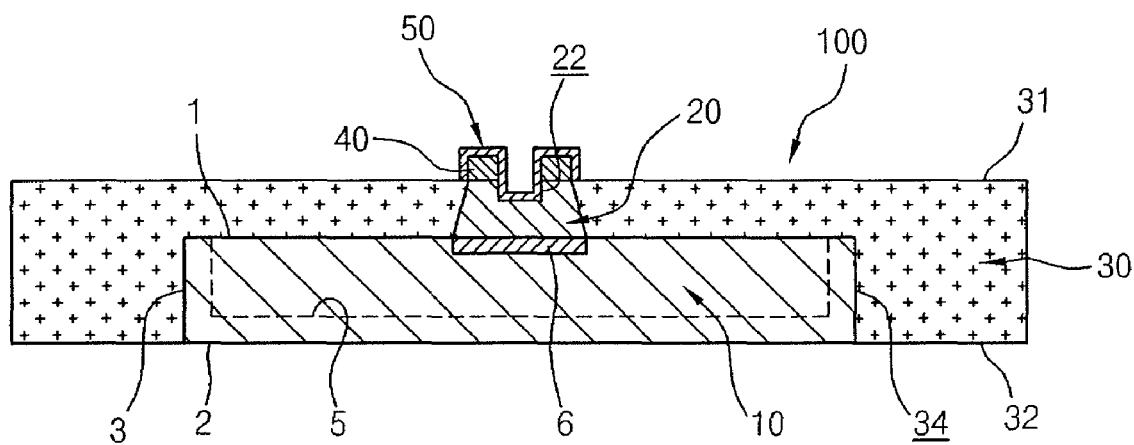
FIG. 15 is a cross-sectional view showing a circuit board having a semiconductor chip in accordance with another embodiment of the present invention. It is understood herein that the drawings are not necessarily to scale and in some instances proportions may have been exaggerated in order to more clearly depict certain features of the invention.

FIG. 15 is a cross-sectional view showing a circuit board having a semiconductor chip in accordance with an embodiment of the present invention. The circuit board having a semiconductor chip in accordance with the embodiment shown in FIG. 14 has the same construction as the circuit board having a semiconductor chip which is described above with reference to FIG. 1, except the bump. Therefore, repeated descriptions of the same component parts will be omitted herein, and the same technical terms and the same reference numerals will be used to refer to the same component parts.

Referring to FIG. 15, a circuit board 100 having a semiconductor chip includes a semiconductor chip 10, a bump 20 having a recess part 22, a circuit board body 30, a wiring line 40, and a reinforcing member 50.

The recess part 22 is defined in the portion of the bump 20 which is exposed through the opening defined in the wiring line 40. The recess part 22 is defined to a predetermined depth when measured from the upper surface of the bump 20. The reinforcing member 50 is formed on the wiring line 20 and the recess part 22 of the bump 20. Due to the presence of the recess part 22, the physical and electrical coupling strength of the wiring line 40 and the bump 20 may be increased.

As is apparent from the above description, in the present invention, after an opening is defined in a wiring line, which is disposed on a bump, in such a way as to expose a portion of the bump, a reinforcing member connects the portion of the bump exposed through the opening and the wiring line so that the bump and the wiring line simply contacting each other may be physically and electrically connected to each other via the reinforcing member, whereby the performance of a circuit board having a semiconductor chip may be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A circuit board comprising:
  a semiconductor chip having an upper surface and side surfaces connected to the upper surface, wherein a bonding pad is disposed on the upper surface of the semiconductor chip;
  a bump disposed over the bonding pad and projecting from the bonding pad by a predetermined height;
  a circuit board body having a recess part, the semiconductor chip being in the recess part such that the upper surface and side surfaces of the semiconductor chip are covered by the circuit board body and an end of the bump is exposed;
  a wiring line disposed on the circuit board body, at least part of the wiring line being positioned over the bump, wherein an opening is formed in a portion of the part of the wiring line over the bump so as to expose the bump; and
  a reinforcing member physically and electrically connecting the bump exposed through the opening and the wiring line.

2. The circuit board according to claim 1, wherein the opening of the wiring line has the shape of a circle, an ellipse, a polygon or a cross when viewed from the top.

3. The circuit board according to claim 1, wherein the reinforcing member comprises a plated layer.

4. The circuit board according to claim 1, wherein the reinforcing member contains the same metal as the bump.

5. The circuit board according to claim 1, wherein the reinforcing member contains a metal different from the bump.

6. The circuit board according to claim 1, wherein the bump contains at least one of gold, chrome, silver, copper, aluminum, nickel and solder.

7. The circuit board according to claim 1, wherein the reinforcing member contains at least one of gold, chrome, silver, copper, aluminum, nickel, solder, and conductive polymer.

8. The circuit board according to claim 1, wherein the wiring line has a width less than that of the bump.

9. The circuit board according to claim 8, wherein the reinforcing member covers the exposed bump and upper and side surfaces of the wiring line.

10. The circuit board according to claim 1, wherein the circuit board body covers the upper surface of the bump so as to be interposed between the bump and the wiring line, the circuit board body including an opening exposing the end of the bump thereby allowing the bump and the wiring line to be physically and electrically connected to each other by the reinforcing member.

11. The circuit board according to claim 1, further comprising:
  a semiconductor device disposed on a surface of the circuit board body and electrically connected to the wiring line.

12. The circuit board according to claim 1, further comprising:
  a semiconductor device disposed within the circuit board body; and
  a conductive via penetrating through the circuit board body so as to electrically connect the semiconductor device to the wiring line.

13. The circuit board according to claim 1, further comprising:
  a cover board disposed on a lower surface of the semiconductor chip which faces away from the upper surface and on a lower surface of the circuit board body which corresponds to the lower surface of the semiconductor chip.

14. The circuit board according to claim 1, further comprising:
  an additional wiring line disposed on a lower surface of the semiconductor chip which faces away from the upper surface and on a lower surface of the circuit board body which corresponds to the lower surface of the semiconductor chip; and
  a conductive via electrically connecting the wiring line and the additional wiring line.

15. The circuit board according to claim 14, wherein a conductive ball is electrically connected to at least one of the wiring line and the additional wiring line.

16. The circuit board according to claim 1, wherein the opening is defined in at least one side surface of the part of the wiring line over the bump so as to expose the bump.

17. The circuit board according to claim 1, wherein the reinforcing member is selectively formed to cover the portion of the bump exposed through the opening and only a portion of the wiring line that is positioned around the opening.

18. The circuit board according to claim 1, wherein the bump has a recess part which is defined at a position corresponding to the opening.

19. The circuit board according to claim 1, wherein at least two wiring lines and at least two circuit board bodies are alternately disposed, and the wiring lines disposed on the respective circuit board bodies are electrically connected by means of conductive vias.

20. A circuit board having a circuit board body with a recess, the circuit board comprising:

a semiconductor chip disposed within the recess, the semiconductor chip having an upper surface and including a bonding pad disposed on the upper surface;

a bump disposed over the bonding pad and projecting from the bonding pad by a predetermined length, wherein an end of the bump is exposed through the recess;

a wiring line disposed on the circuit board body, at least part of the wiring line being positioned over the bump, and an opening formed in a portion of the part of the wiring line positioned over the bump so as to expose the bump a reinforcing member physically and electrically connecting the portion of the bump exposed through the opening and the wiring line.

* * * * *